(12) United States Patent
Wang et al.

(10) Patent No.: US 9,659,987 B2
(45) Date of Patent: May 23, 2017

(54) APPROACH FOR REDUCING PIXEL PITCH USING VERTICAL TRANSFER GATES AND IMPLANT ISOLATION REGIONS

(71) Applicant: Taiwan Semiconductor Manufacturing Co., Ltd., Hsin-Chu (TW)

(72) Inventors: Tzu-Jui Wang, Fengshan (TW);
Yuichiro Yamashita, Hsinchu (TW);
Seiji Takahashi, Hsinchu (TW);
Jen-Cheng Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/490,824

(22) Filed: Sep. 19, 2014

(65) Prior Publication Data

US 2016/0086984 A1 Mar. 24, 2016

(51) Int. Cl.
*H01L 27/146* (2006.01)

(52) U.S. Cl.
CPC .... *H01L 27/1463* (2013.01); *H01L 27/14603* (2013.01); *H01L 27/14614* (2013.01); *H01L 27/14638* (2013.01); *H01L 27/14641* (2013.01); *H01L 27/14643* (2013.01); *H01L 27/14687* (2013.01); *H01L 27/14689* (2013.01)

(58) Field of Classification Search
CPC ... H01L 31/0224; H01L 31/18; H01L 27/146; H01L 31/00; H01L 27/1463; H01L 24/14632; H01L 27/14614; H01L 27/14687; H01L 27/14689; H01L 27/14643; H01L 29/423; H01L 29/66; H01L 29/51; H01L 29/514; H01L 29/42364; H01L 27/14603; H01L 27/14638; H01L 27/14641
USPC ................................ 257/272, 292, 215, 334
See application file for complete search history.

(56) References Cited

U.S. PATENT DOCUMENTS

| | | | | |
|---|---|---|---|---|
| 2008/0153193 A1* | 6/2008 | Lyu | ................. | H01L 27/14603 438/59 |
| 2008/0277693 A1* | 11/2008 | Mauritzson | ....... | H01L 27/14603 257/205 |
| 2009/0050997 A1* | 2/2009 | Mutoh | .............. | H01L 27/14609 257/440 |
| 2009/0303371 A1* | 12/2009 | Watanabe | ......... | H01L 27/14603 348/311 |
| 2010/0108864 A1* | 5/2010 | Ohta | ................. | H01L 27/14614 250/214.1 |

(Continued)

*Primary Examiner* — Chuong A Luu
(74) *Attorney, Agent, or Firm* — Eschweiler & Potashnik, LLC

(57) ABSTRACT

An active pixel sensor (APS) with a vertical transfer gate and a pixel transistor (e.g., a transfer transistor, a source follower transistor, a reset transistor, or a row select transistor) electrically isolated by an implant isolation region is provided. A semiconductor substrate has a photodetector buried therein. The vertical transfer gate extends into the semiconductor substrate with a channel region in electrical communication with the photodetector. The pixel transistor is arranged over the photodetector and configured to facilitate the pixel operation (e.g., reset, signal readout, etc.). The implant isolation region is arranged in the semiconductor substrate and surrounds and electrically isolates the pixel transistor. A method for manufacturing the APS is also provided.

20 Claims, 8 Drawing Sheets

(56) References Cited

U.S. PATENT DOCUMENTS

| | | | |
|---|---|---|---|
| 2010/0203667 A1* | 8/2010 | Hirota | H01L 27/14698 438/72 |
| 2010/0314672 A1* | 12/2010 | Manda | H01L 27/14609 257/292 |
| 2011/0089311 A1* | 4/2011 | Venezia | H01L 27/14603 250/208.1 |
| 2013/0009224 A1* | 1/2013 | Ohri | H01L 27/1461 257/292 |
| 2013/0175582 A1* | 7/2013 | Ihara | H01L 27/1461 257/222 |
| 2013/0221410 A1* | 8/2013 | Ahn | H01L 31/0232 257/225 |
| 2015/0372034 A1* | 12/2015 | Chen | H01L 27/14614 257/292 |

* cited by examiner

APPROACH FOR REDUCING PIXEL PITCH USING VERTICAL TRANSFER GATES AND IMPLANT ISOLATION REGIONS

BACKGROUND

Digital cameras and optical imaging devices employ image sensors. Image sensors convert optical images to digital data that may be represented as digital images. An image sensor includes an array of pixel sensors, which are unit devices for the conversion of an optical image into digital data. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
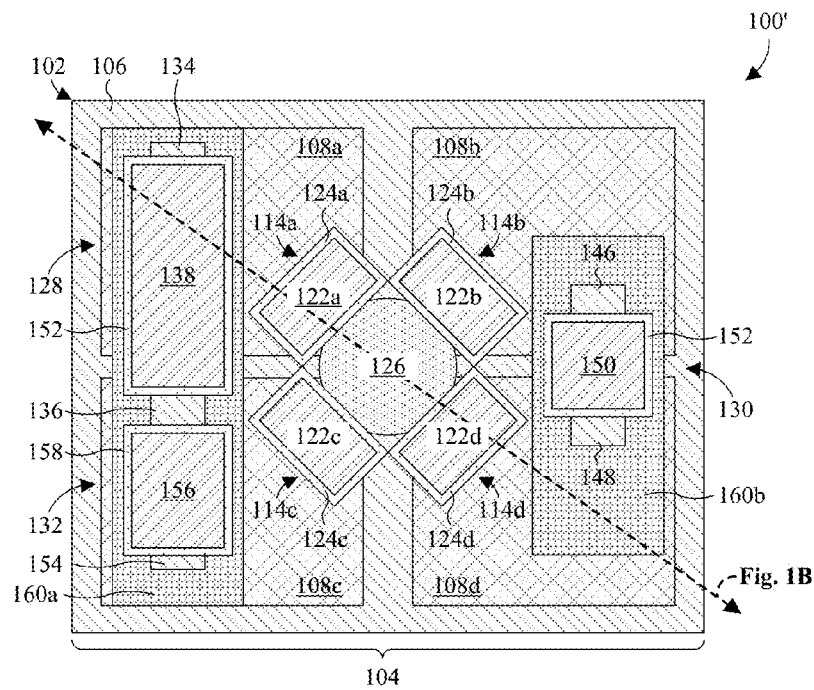
FIG. 1A illustrates a top view of some embodiments of an active pixel sensor (APS) with a vertical transfer gate and a pixel transistor electrically isolated by an implant isolation region.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices, such as cameras, cellular telephones, personal digital assistants (PDAs), MP3 players, computers and other devices, include an image sensor for capturing images. One example of such an image sensor is a complementary metal-oxide semiconductor (CMOS) image sensor (CIS) including an array of active pixel sensors (APSs). An APS records the intensity of incident light using a photodetector, such as a photodiode, and facilitates digital readout of the recording with a plurality of pixel transistors. According to some types of APS, such as a four transistor (4T) APS, the plurality of pixel transistors include a source follower transistor and a transfer transistor.

Increasingly, CISs are being scaled down to reduce pixel pitch (i.e., the distance between APSs) to sub-micrometer levels (e.g., less than 0.75 micrometers). At such levels, isolation between the pixel transistors and the photodetectors is of great importance for proper operation. The pixel transistors and the photodetectors of a CIS are typically isolated from each other by shallow trench isolation (STI) regions. However, the formation of STI regions causes damage to silicon-based surfaces, which can critically damage the CISs at sub-micrometer levels. Further, the STI regions prevent the uniform doping of collector regions of the photodetectors, since the implant is performed through the oxide of the STI regions, which causes implant species scattering in the collector regions. The non-uniform doping, in turn, reduces performance, such as sensitivity, of the photodetectors.

Beyond isolation, the surface areas of individual APSs are more limited at sub-micrometer pitches. This increases the difficulty with which improvements in the full well capacity, signal-to-noise ratio (SNR), and sensitivity of APSs are achieved. For APSs including transfer transistors, such as four transistor APSs, the photodetector surface area for a given full well capacity can be reduced by using vertical transfer gates instead of traditional planar transfer gates. The vertical transfer gates allow collector regions of the photodetectors to be buried deeper and extend deeper into the semiconductor substrate than would otherwise be possible. Hence, the photodetectors can be retracted laterally and expanded vertically to reduce surface area while maintaining a given full well capacity.

Despite the improvement in surface area utilization of APS s when using vertical transfer gates, the surface areas of APS are still not fully utilized. The STI regions preclude the arrangement of the pixel transistors over the photodetectors. Further, APS s in which multiple photodetectors share common transistors (i.e., shared pixel APSs) are precluded due to the surface area constraints. Therefore, the present disclosure is directed to an improved APS using implant isolation regions in lieu of STI regions and vertical transfer gates in lieu of planar transfer gates.

The implant isolation regions advantageously require no extra etching of the semiconductor substrate over and/or within which CISs are formed, thereby eliminating or otherwise reducing damage caused to silicon-based surfaces. Further, the implant isolation regions advantageously allow the pixel transistors to be arranged over the photodetectors, which allows shared pixel APSs. The vertical transfer gates advantageously allow the collector regions of the photodetectors to be buried deeper than would otherwise be possible with planar transfer gates. Collectively, the implant isolation regions and the vertical transfer gates improve the surface area utilization of APSs. This, in turn, allows a reduced pixel pitch, and a more flexible layout arrangement (e.g., a larger source follower transistor for noise reduction).

With reference to FIGS. 1A & B, top and cross-sectional views 100', 100" are respectively illustrated for some embodiments of a semiconductor structure or integrated circuit including an APS 102 arranged within a semiconductor substrate 104. The semiconductor substrate 104 is, for example, about 2-3 micrometers thick. Further, the semiconductor substrate 104 is, for example, a bulk substrate of silicon, germanium, or group III and group V elements. Alternatively, the semiconductor substrate 104 is, for example, a semiconductor-on-insulator (SOI) substrate.

The semiconductor substrate 104 includes one or more peripheral isolation regions 106 and one or more pixel regions 108a-d. The peripheral isolation regions 106 surround the pixel regions 108a-d and electrically isolate the pixel regions 108 from each other. The pixel regions 108 correspond to one or more pixels of the APS 102, typically with a one-to-one correspondence. A pixel is the smallest area to which a photon incident on the APS 102 can be localized. In some embodiments, the pixel regions 108 include a single pixel region. In other embodiments, the pixel regions 108 include multiple pixel regions 108. For example, the pixel regions 108 can include a 2×2 array of pixel regions (i.e., 2 rows and 2 columns) or a 1×4 array of pixel regions (i.e., 1 row and 4 columns). The pixel regions 108 correspond to n- or p-type regions (e.g., well regions) of the semiconductor substrate 104, and the peripheral isolation regions 106 correspond to n- or p-type regions of the semiconductor substrate 104. The pixel regions 108 are typically of the same type (i.e., p- or n-type) as the peripheral isolation regions 106, but more lightly doped than the peripheral isolation regions 106. For example, the pixel regions 108 correspond to p-type regions, whereas the peripheral isolation regions 106 correspond to p+-type regions.

One or more photodetectors (PDs) 110a, 110d of the APS 102 correspond to the pixel regions 108, typically with a one-to-one correspondence. The photodetectors 110 are configured to accumulate charge (e.g., electrons) from photons incident on the photodetectors 110, and are, for example, photodiodes. The photodetectors 110 each include a collector region (CR) 112a, 112d buried in the corresponding pixel region 108, and regions of the pixel region 108 surrounding and abutting the collector region 112. The collector region 112 is, for example, arranged greater than or equal to about 0.2 micrometers below a top surface of the pixel region 108, and/or the collector region 112 has, for example, a thickness of about 2-2.8 micrometers. The collector region 112 stores accumulated charge and is a doped semiconductor region having an opposite type (i.e., p- or n-type) as the pixel region 108. For example, the collector region 112 corresponds to an n-type doped region when the pixel region 108 is of p-type.

One or more transfer transistors 114a-d of the APS 102 are arranged proximate to or over corresponding collector regions 112 with corresponding channel regions 116a, 116d (i.e., regions where inversion channels form) overlapping with the corresponding collector regions 112. Typically, there is a one-to-one correspondence between the transfer transistors 114 and the collector regions 112. The transfer transistors 114 each include a trench 118a, 118d extending into the pixel region 108 of the corresponding collector region 112 and, in some embodiments, into the corresponding collector region 112. Typically, the trench 118 extends to a depth greater than or equal to about 1000-4000 Angstroms below a top surface of the pixel region 108. Filling the trench 118, the transfer transistor 114 includes a transfer gate dielectric structure 120a, 120d and a vertical transfer gate 122a-d. The transfer gate dielectric structure 120 lines the trench 118 between the pixel region 108 and the vertical transfer gate 122 to electrically isolate the vertical transfer gate 122 from the pixel region 108 and/or the collector region 112. The transfer gate dielectric structure 120 and the vertical transfer gate 122 are respectively, for example, silicon dioxide and polysilicon. Disposed on and/or along sidewalls of the vertical transfer gate 122 and the transfer gate dielectric structure 120, the transfer transistor 114 includes a transfer gate sidewall structure 124a-d. The transfer gate sidewall structure 124 is, for example, a dielectric, such as, for example, silicon dioxide or silicon nitride.

By employing vertical transfer gates 122, the collector regions 112 can be buried deeper and extend farther into the corresponding pixel regions 108. This advantageously allows the surface area employed for the corresponding photodetectors 110 to be reduced, while maintaining the same full well capacity. Further, this advantageously allows the size of the APS 102 to be reduced and/or a more flexible layout of surface components (e.g., the transfer transistors 114) of the APS 102.

A floating diffusion node (FDN) 126 of the APS 102 is arranged over the peripheral isolation region 106 in electrical communication with the channel regions 116 of the transfer transistors 114. For example, the FDN 126 is arranged between all of the channel regions 116 of the transfer transistors 114. When a transfer transistor 114 is activated (e.g., by applying a voltage to the vertical transfer gate 122 of the transfer transistor 114), an inversion channel is formed in the channel region 116 of the transfer transistor 114, thereby allowing accumulated charge in the corresponding photodetector 110 to flow from the collector region 112 to the FDN 126. The FDN 126 is, for example, a doped semiconductor region having an opposite type (i.e., p- or n-type) as the pixel regions 108, such as, for example, n-type. Typically, the FDN 126 and the collector regions 112 have the same type and double as source/drain regions for the transfer transistors 114.

A source follower transistor 128 and, in some embodiments, a reset (RST) transistor 130 and/or a row select (RS) transistor 132 are arranged over the photodetectors 110. These transistors 128, 130, 132 facilitate pixel operations, such as reset and readout of charge stored at the FDN 126.

The source follower transistor 128 allows the charge at the FDN 126 to be observed without removing the accumulated charge. The source follower transistor 128 includes a pair of source follower source/drain regions 134, 136 arranged on opposite sides of a source follower gate 138 and a source follower channel region 140. In some embodiments, the source follower gate 138 is connected to the FDN 126, and the source follower source/drain regions 134, 136 are connected between a power source (not shown) and an output (not shown) of the APS 102. The source follower transistor 128 further includes a source follower gate dielectric structure 142 arranged between the source follower gate 138 and the peripheral isolation and/or pixel regions 106, 108, and a source follower gate sidewall structure 144 arranged along sidewalls of the source follower gate 138 and the source follower gate dielectric structure 142. The source follower gate 138, the source follower gate dielectric structure 142, and the source follower gate sidewall structure 144 are respectively, for example, silicon dioxide, polysilicon, and silicon dioxide. The source follower source/drain regions 134, 136 are, for example, doped semiconductor regions having an opposite type as the pixel regions 108, such as, for example, n-type.

The reset transistor 130 clears charge stored at the FDN 126 when active. The reset transistor 130 includes a pair of reset source/drain regions 146, 148 arranged on opposite sides of a reset gate 150 and a reset channel region (not shown). In some embodiments, the reset source/drain regions 146, 148 are connected between the power source and the FDN 126. The reset transistor 130 further includes a reset gate dielectric structure (not shown) arranged between the reset gate 150 and the peripheral isolation and/or pixel regions 106, 108, and a reset gate sidewall structure 152 arranged along sidewalls of the reset gate 150 and the reset gate dielectric structure. The reset gate 150, the reset gate dielectric structure, and the reset gate sidewall structure 152 are respectively, for example, silicon dioxide, polysilicon, and silicon dioxide. The reset source/drain regions 146, 148 are, for example, doped semiconductor regions having an opposite type as the pixel regions 108, such as, for example, n-type.

The row select transistor 132 facilitates selection of the APS 102 when arranged in a row with other APSs. The row select transistor 132 includes a pair of row select source/drain regions 136, 154 arranged on opposite sides of a row select gate 156 and a row select channel region (not shown). In some embodiments, the row select source/drain regions 136, 154 are connected between the source follower transistor 128 and the output, or between the power source and the source follower transistor 128. Further, in some embodiments, the row select transistor 132 shares a source/drain region 136 with the source follower transistors 128. The row select transistor 132 further includes a row select gate dielectric structure (not shown) arranged between the row select gate 156 and the peripheral isolation and/or pixel regions 106, 108, and a row select gate sidewall structure 158 arranged along sidewalls of the row select gate 156 and the row select gate dielectric structure. The row select gate 156, the row select gate dielectric structure, and the row select gate sidewall structure 158 are respectively, for example, silicon dioxide, polysilicon, and silicon dioxide. The row select source/drain regions 136, 154 are, for example, doped regions having an opposite type as the pixel regions 108, such as, for example, n-type.

Implant isolation regions 160a, 160b are arranged within the peripheral isolation and/or pixel regions 106, 108 around at least one pixel transistor 114, 128, 130, 132 of the APS 102 and, in some embodiments, at least one photodetector 110 of the APS 102. The pixel transistors 114, 128, 130, 132 of the APS 102 include the transfer transistors 114, the source follower transistor 128, the reset transistor 130 and the row select transistor 132. The implant isolation regions 160 provide electrical isolation and are, for example, highly doped semiconductor regions (relative to the pixel regions 108) of the same type as the pixel regions 108, so as to prevent charge from migrating out of the channel regions 116, 140 of the pixel transistors 114, 128, 130, 132 and/or the transfer transistors 114, and/or out of the collector regions 112.

The implant isolation regions 160 are used in lieu of STI regions for electrical isolation. The implant isolation regions 160 advantageously allow electrical isolation without etching the pixel and/or peripheral isolation regions 106, 108, which can cause damage to silicon-based surfaces. Further, using the implant isolation regions 160 in lieu of STI regions advantageously allows uniform doping of the collector regions 112. Without the STI regions, the doping of the collectors regions 112 is not performed through the oxide of the STI regions. Therefore, there is no or minimal implant species scatter in the collector regions 112. Even more, using the implant isolation regions 160 in lieu of STI regions advantageously allows the pixel transistors 114, 128, 130, 132 to be arranged over the photodetectors 110. This, in turn, allows the size of the APS 102 to be reduced and a more flexible layout of surface components of the APS 102.

Collectively, the vertical transfer gates 122 and the implant isolation regions 160 allow the size of the APS 102 to be reduced to sub-micrometer levels. Further, the vertical transfer gates 122 and the implant isolation regions 160 collectively allow the APS 102 to include a shared pixel architecture. As described above, a pixel is the smallest area to which a photon incident on the APS 102 can be localized and corresponds to a photodetector 110. Shared pixel architectures include a plurality of photodetectors 110 sharing a FDN 126 and pixel transistors 114, 128, 130, 132. In some embodiments, the transfer transistors 114 are specific to the photodetectors 110. For example, as illustrated, the APS 102 includes four photodetectors 110 sharing a FDN 126, a source follower transistor 128, a reset transistor 130, and a row select transistor 132.

Figure 2:
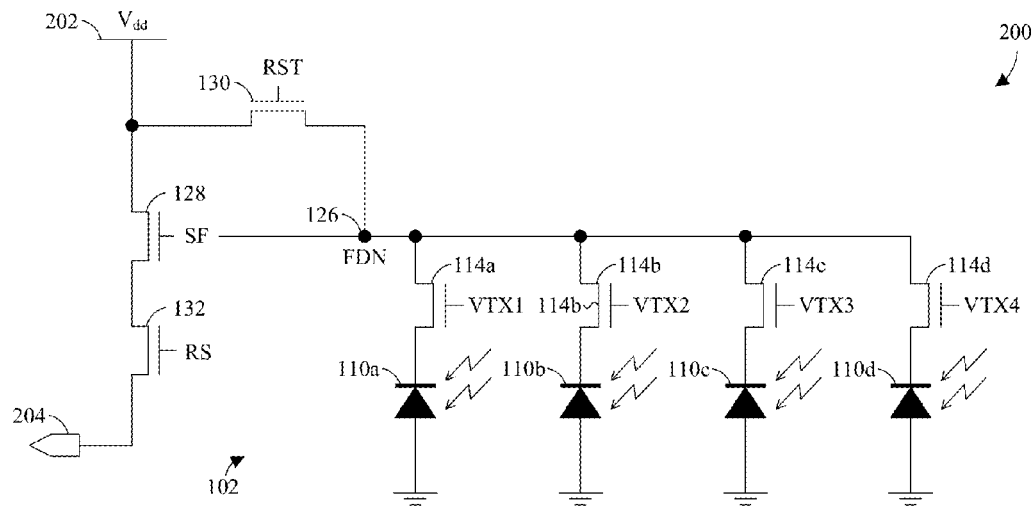
FIG. 2 illustrates a circuit diagram of some embodiments of an APS with a vertical transfer gate and a pixel transistor electrically isolated by an implant isolation region.

With reference to FIG. 2, a circuit diagram 200 of the APS 102 according to some embodiments is provided. As shown, the APS 102 includes one or more photodetectors 110a-d electrically connected to a FDN 126 by way of corresponding transfer transistors 114a-d. The photodetectors 110 accumulate charge (e.g., electrons) from photons incident on the photodetectors 110. The transfer transistors 114 selectively transfer charge from the photodetectors 110 to the FDN 126. A reset transistor 130 is electrically connected between a power source 202 and the FDN 126 to selectively clear charge at the FDN 126. A source follower transistor 128 is electrically connected between the power source 202 and an output 204, and gated by the FDN 126, to allow the charge at the FDN 126 to be observed without removing the charge. A row select transistor 132 is electrically connected between the source follower transistor 128 and the output 204 to selectively output a voltage proportional to the voltage at the FDN 126.

During use of the APS 102, the APS 102 is exposed to an optical image for a predetermined integration period. Over this period of time, the APS 102 records the intensity of light incident on the photodetectors 110 by accumulating charge proportional to the light intensity in collector regions (not shown) of the photodetectors 110. After the predetermined integration period, the amount of accumulated charge is read for each of the photodetectors 110. In some embodiments the amount of accumulated charge for a photodetector 110 is read by momentarily activating the reset transistor 130 to clear the charge stored at the FDN 126. Thereafter, the row select transistor 130 is activated and the accumulated charge of the photodetector 110 is transferred to the FDN 126 by activating the transfer transistor 114 of the photodetector 110 for a predetermined transfer period. During the predetermined transfer period, the voltage at the output 204 is monitored. As the charge is transferred, the voltage at the output 204 varies, typically decreasing. After the predetermined transfer period, the change in the voltage observed at the output 204 is proportional to the intensity of light recorded at the photodetector 110.

Figure 1B:
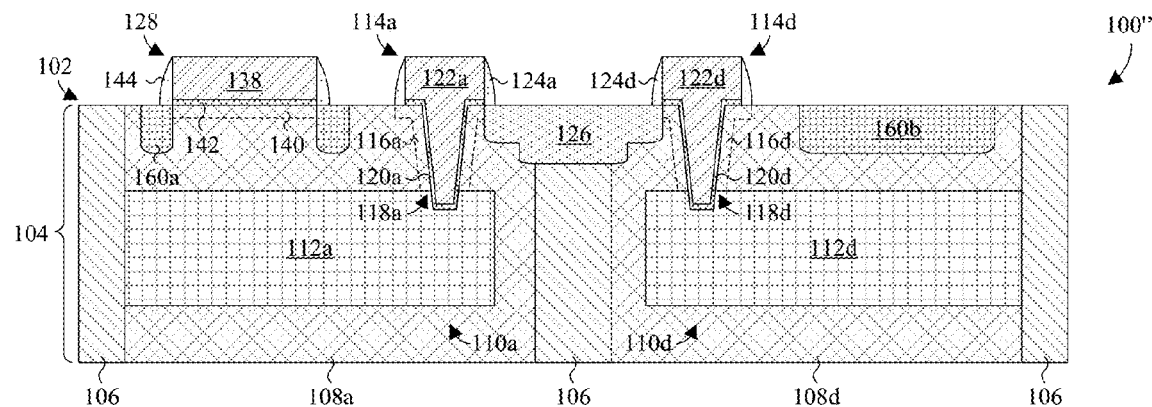
FIG. 1B illustrates a cross-sectional view of some embodiments of the APS of FIG. 1A.
Figure 3:
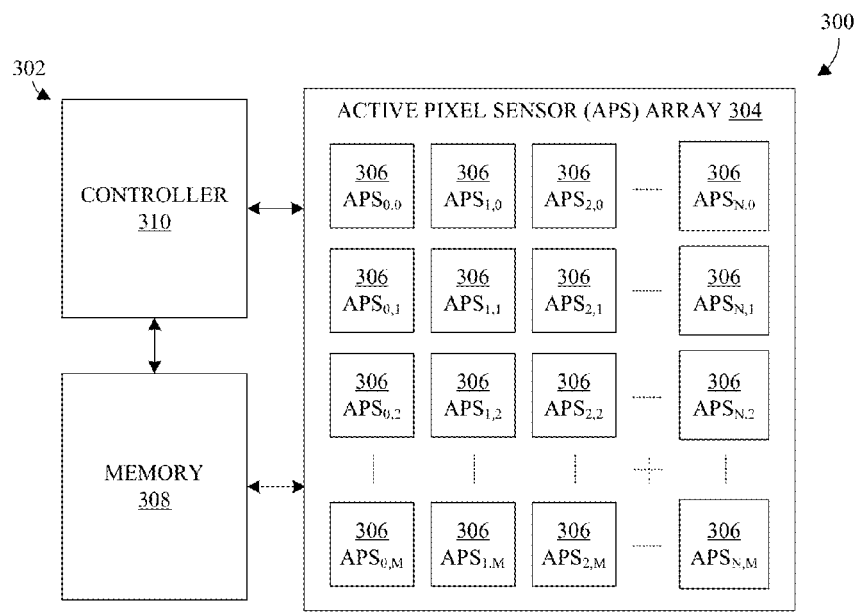
FIG. 3 illustrates a block diagram of some embodiments of a complementary metal oxide semiconductor (CMOS) image sensor (CIS) including an array of APSs with vertical transfer gates and pixel transistors electrically isolated by implant isolation regions.

With reference to FIG. 3, a block diagram 300 of a CIS 302 according to some embodiments is provided. The CIS 302 includes an APS array 304 of one or more APSs 306 arranged in a series of N>0 rows and M>0 columns. For example, the APS array 304 can include N=2448 and M=3264, as is common for modern 8 megapixel cameras. The APSs 306 are as described in FIGS. 1A, 1B and 2, and include vertical transfer gates (not shown), photodetectors (not shown), pixel transistors (not shown) arranged over the photodetectors, and implant isolation regions (not shown) for the pixel transistors. For readability, the APSs 306 are labeled according to the following naming convention: $APS_{<column, row>}$.

Because APSs 306 are naturally "color blind" (i.e., the corresponding photodetectors cannot distinguish between light of different colors), the CIS 302 typically includes or is otherwise associated with a color filter array (not shown). The color filter array is a mosaic of tiny color filters placed over the APS array 304 to assign colors to the APSs 306. A commonly used color filter array is the Bayer filter. The Bayer filter includes a mosaic of red, green and blue filters arranged in a filter pattern of 50% green, 25% red, and 25% blue. Such an arrangement of filters is advantageous because red, green, and blue can be mixed in different combinations to produce most of the colors visible to the human eye.

During image capture, a shutter (not shown) is opened to expose the APS array 304 to an optical image for a predetermined integration period. Over this period, the APSs 306 record light impingent at their respective array locations to generate image data. After the predetermined integration period, the image data is transferred and stored in a memory 308 by a controller 310. Further, the controller 310 determines the light intensity recorded at each individual APS 306 to reconstruct a digital representation of the optical image. To obtain a full-color image, various demosaicing algorithms can, for example, be used to interpolate a set of complete red, green, and blue values for each pixel. In this way, color images can be digitally recorded so users can share the images on a computer, share them with friends, and the like.

Figure 4:
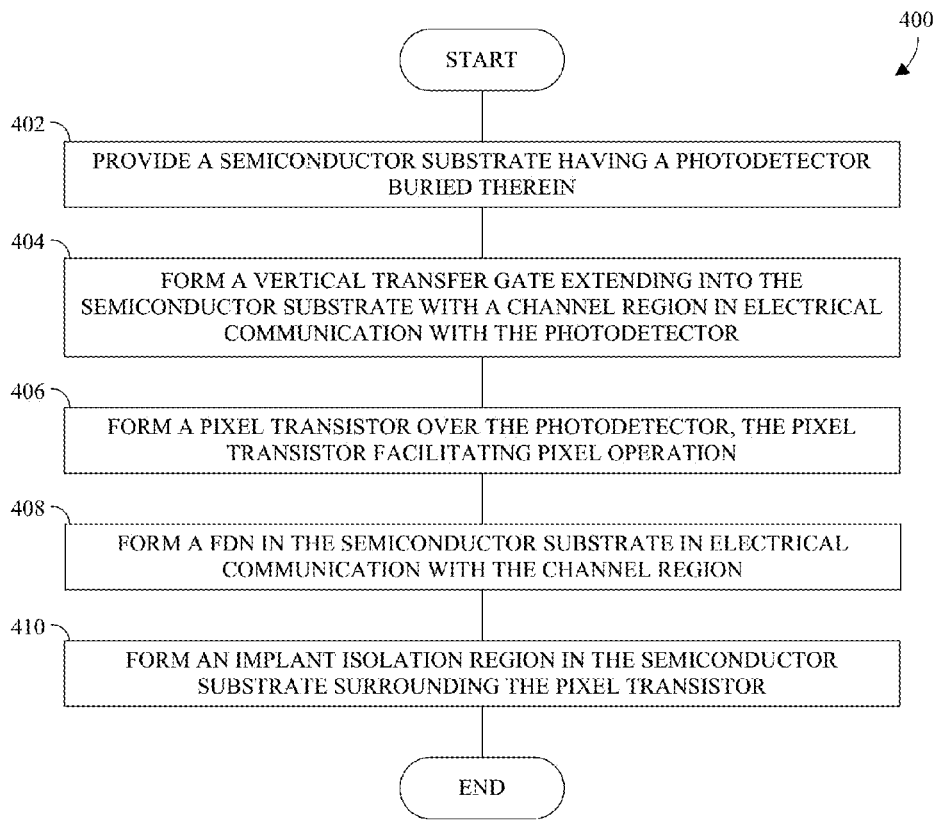
FIG. 4 illustrates a flowchart of some embodiments of a method for manufacturing an APS with a vertical transfer gate and a pixel transistor electrically isolated by an implant isolation region.

With reference to FIG. 4, a flow chart 400 provides some embodiments of a method for manufacturing an APS employing vertical transfer gates in lieu of planar transfer gates and employing implant isolation regions in lieu of STI regions. An example of the APS is shown in FIGS. 1A & B.

According to the method, a semiconductor substrate having a photodetector buried therein is provided (Action 402).

A vertical transfer gate extending into the semiconductor substrate is formed (Action 404). The vertical transfer gate has a channel region (i.e., a region where an inversion channel forms upon activating the vertical transfer gate) in electrical communication with the photodetector (e.g., a collector region of the photodetector). The vertical transfer gate allows the photodetector to be buried deeper and extend farther into the semiconductor substrate. This advantageously allows the surface area employed for the photodetector to be reduced, while maintaining the same full well capacity. Further, this advantageously allows the size of the APS to be reduced and/or a more flexible layout of surface components of the APS.

A pixel transistor is formed (Action 406) over the photodetector. The pixel transistor facilitates pixel operation (e.g., reset, signal readout, etc.). Pixel transistors include transfer transistors, a source follower transistor, a reset transistor, and a row select transistor.

A FDN is formed (Action 408) in the semiconductor substrate in electrical communication with the channel region.

An implant isolation region is formed (Action 410) in the semiconductor substrate surrounding the pixel transistor. The implant isolation region advantageously allows electrical isolation of the pixel transistor without etching of the semiconductor substrate, which can cause damage to silicon-based surfaces. Further, using the implant isolation region in lieu of an STI region advantageously allows uniform doping of a collector region of the photodetector and allows the pixel transistor to be arranged over the photodetector. The latter allows the size of the APS to be reduced and a more flexible layout of surface components of the APS.

The vertical transfer gate and the implant isolation region collectively allow the size of the APS to be reduced to sub-micrometer levels and allow the APS to include multiple pixels. As described above, a pixel is the smallest area to which a photon incident on the APS can be localized and corresponds to a photodetector.

While the disclosed methods (e.g., the method described by the flowchart 400) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-14, cross-sectional views of some embodiments of a semiconductor structure or integrated circuit of an APS at various stages of manufacture are provided to illustrate the method. Although FIGS. 5-14 are described in relation to the method, it will be appreciated that the structures disclosed in FIGS. 5-14 are not limited to the method, but instead may stand alone as structures independent of the method. Similarly, although the method is described in relation to FIGS. 5-14, it will be appreciated that the method is not limited to the structures disclosed in FIGS. 5-14, but instead may stand alone independent of the structures disclosed in FIGS. 5-14.

Figure 5:
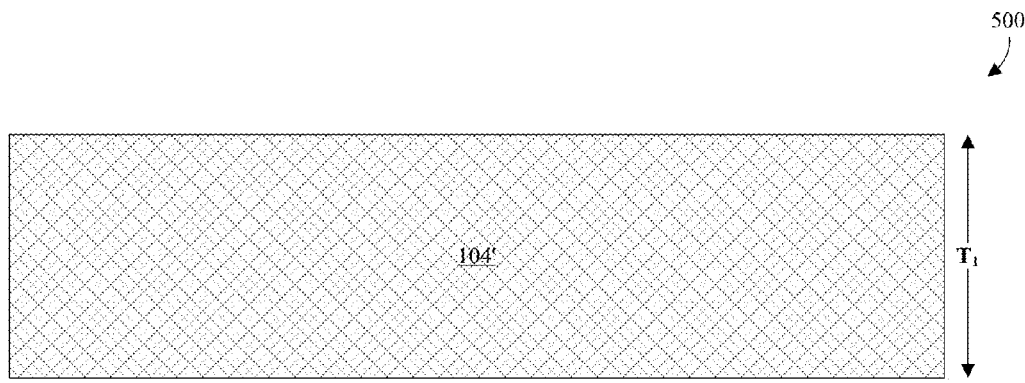
FIGS. 5-14 illustrate a series of cross-sectional views of some embodiments of an APS at various stages of manufacture, the APS including a vertical transfer gate and a pixel transistor electrically isolated by an implant isolation region.
Figure 6:
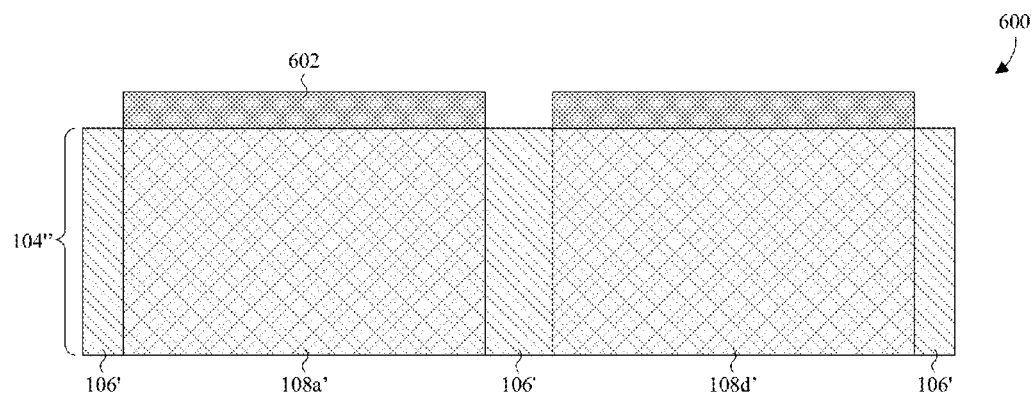
Figure 7:
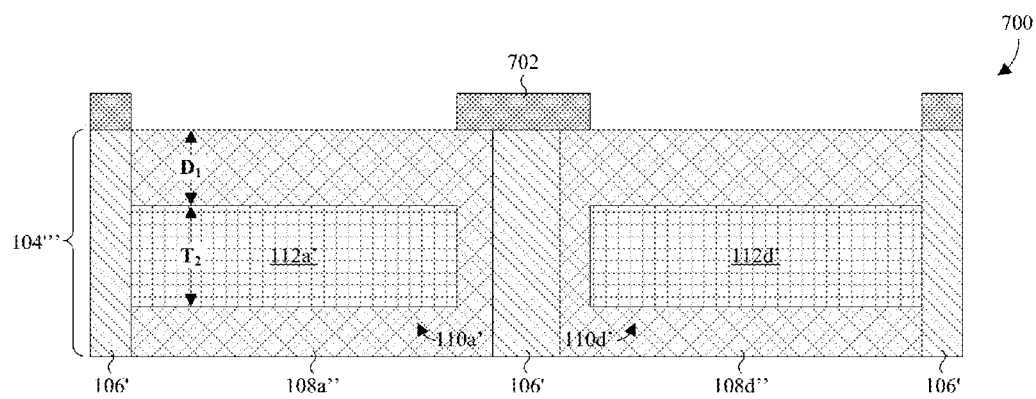

FIGS. 5-7 illustrate cross-sectional views 500, 600, 700 of some embodiments corresponding to Action 402.

As shown by FIG. 5, a semiconductor substrate 104' is provided. The semiconductor substrate 104' has a thickness $T_1$ of, for example, about 2-3 micrometers and/or is, for example, n- or p-type. Further, the semiconductor substrate 104' is, for example, a bulk substrate of silicon, germanium, or group III and group V elements. Alternatively, the semiconductor substrate 104' is, for example, a semiconductor-on-insulator (SOI) substrate.

As shown by FIG. 6, one or more peripheral isolation regions 106' and one or more pixel regions 108a', 108d' are formed in the semiconductor substrate 104'. The peripheral isolation regions 106' surround the pixel regions 108' and electrically isolate the pixel regions 108' from each other. The pixel regions 108' correspond to one or more pixels, typically with a one-to-one correspondence. The pixel regions 108' correspond to n- or p-type regions (e.g., well regions) of the semiconductor substrate 104', and the peripheral isolation regions 106' correspond to n- or p-type regions of the semiconductor substrate 104'. The pixel regions 108' are typically of the same type (i.e., p- or n-type) as the peripheral isolation regions 106', but more lightly doped than the peripheral isolation regions 106'.

In some embodiments, the peripheral isolation regions 106' are formed by performing a first ion implantation. For example, a first mask layer 602 is formed over the semiconductor substrate 104'. The first mask layer 602 masks regions of the semiconductor substrate 104' corresponding to the pixel regions 108', while leaving regions of the semiconductor substrate 104' corresponding to the peripheral isolation regions 106' exposed. The first ion implantation is then performed into the exposed regions of the semiconductor substrate 104' to form the peripheral isolation regions 106'.

In some embodiments, the pixel regions 108' are formed by performing a second ion implantation. For example, a second mask layer (not shown) is formed over the semiconductor substrate 104'. The second mask layer masks regions of the semiconductor substrate 104' corresponding to the peripheral isolation region 106', while leaving regions of the semiconductor substrate 104' corresponding to the pixel regions 108' exposed. The second ion implantation is then performed into the exposed regions of the semiconductor substrate 104' to form the pixel regions 108'. In other embodiments, the pixel regions 108' are formed by forming the peripheral isolation regions 106'. For example, where the semiconductor substrate 104' has a nominal concentration of dopants relative to the peripheral isolation regions 106' and is of the same type used in the peripheral isolation regions 106', the regions of the semiconductor substrate 104' surrounded by the peripheral isolation regions 106' correspond to the pixel regions 108'.

As shown by FIG. 7, collector regions 112a', 112d' corresponding to the pixel regions 108' are buried in the corresponding pixel regions 108' to form photodetectors 110a', 110d'. Typically, there is a one-to-one correspondence between the pixel regions 108' and the collector regions 112'. The photodetectors 110' each include a corresponding one of the collector regions 112' and are configured to accumulate charge from photons incident on the photodetectors 110'. The collector regions 112' are, for example, arranged a depth $D_1$ greater than or equal to about 0.2 micrometers below a top surface of the corresponding pixel regions 108', and/or the collector regions 112' have, for example, a thickness $T_2$ of about 2-2.8 micrometers. The collector regions 112' are doped semiconductor regions having an opposite type (i.e., p- or n-type) as the corresponding pixel regions 108'. For example, the collector regions 112' correspond to n-type doped regions when the pixel regions 108' are of p-type.

In some embodiments, the collector regions 112' are formed by performing a third ion implantation. For example, a third mask layer 702 is formed over the semiconductor substrate 104". The third mask layer 702 masks regions of the semiconductor substrate 104" other than those regions corresponding to the collector regions 112', while leaving regions of the semiconductor substrate 104" corresponding to the collector regions 112' exposed. The third ion implantation is then performed into the exposed regions of the semiconductor substrate 104" to form the collector regions 112'.

Figure 8:
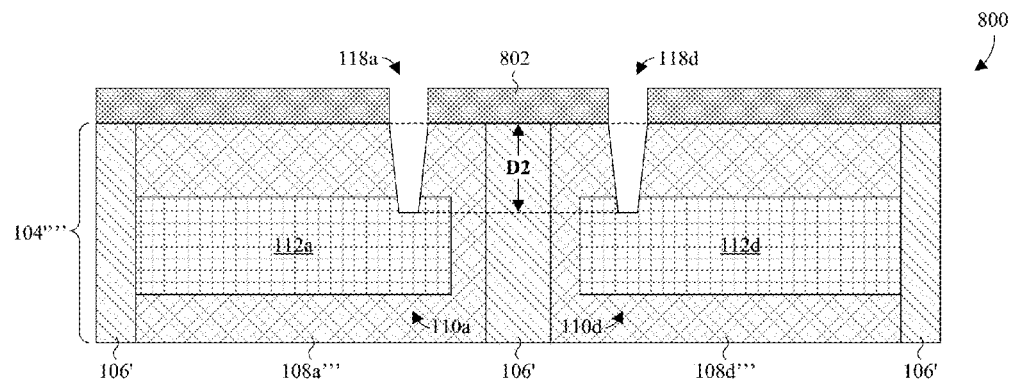
Figure 9:
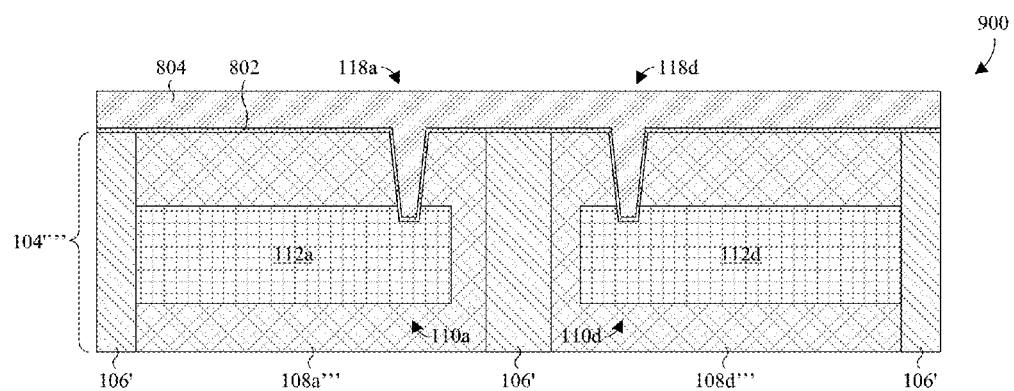
Figure 10:
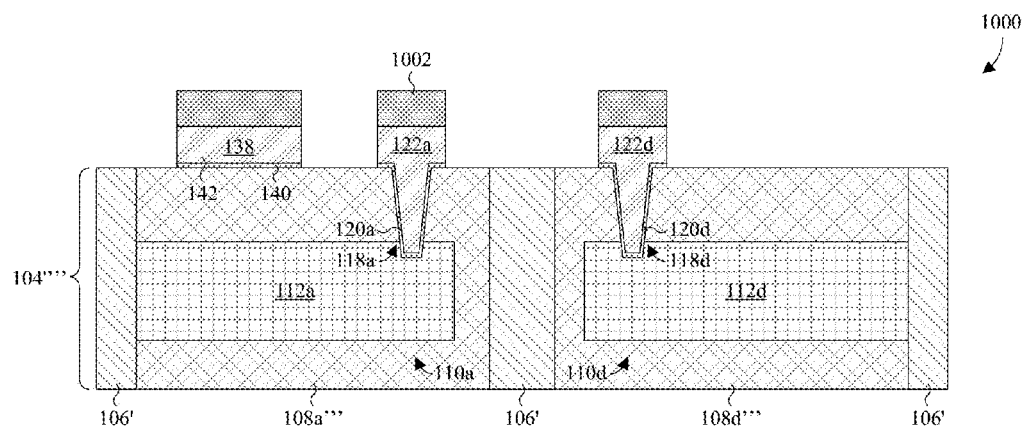

FIGS. 8-10 illustrate cross-sectional views 800, 900, 1000 of some embodiments corresponding to Actions 404 & 406.

As shown by FIG. 8, trenches 118a, 118d corresponding to the collector regions 112' are formed. Typically, there is a one-to-one correspondence between the trenches 118 and the collector regions 112'. Each trench 118 extends into the pixel region 108''' of the corresponding collector region 112' and, in some embodiments, into the corresponding collector region 112'. Typically, the trench 118 extends to a depth $D_2$ greater than or equal to about 1000-4000 Angstroms below a top surface of the pixel region 108'''.

In some embodiments, the trenches 118 are formed by performing a first etch. For example, a fourth mask layer 802 is formed over the semiconductor substrate 104'. The fourth mask layer 802 masks regions of the semiconductor substrate 104''' other than those regions corresponding to the trenches 118, while leaving regions of the semiconductor substrate 104''' corresponding to the trenches 118 exposed. The first etch is then performed into the exposed regions of the semiconductor substrate 104''' to form the trenches 118.

As shown by FIG. 9, a first dielectric layer 902 is conformally formed over the semiconductor substrate 104" to line the trenches 118. The first dielectric layer 902 is, for example, silicon dioxide, silicon nitride, or silicon oxynitride.

Also shown by FIG. 9, a conductive layer 904 is formed over the first dielectric layer 902 to fill the trenches 118 or otherwise line the trenches 118. The conductive layer 904 is, for example, a metal, such as tungsten or copper, or polysilicon.

As shown by FIG. 10, transfer gate dielectric structures 120a, 120d corresponding to the trenches 118, and vertical transfer gates 122a, 122d corresponding to the trenches 118, are formed filling the corresponding trenches 118. The transfer gate dielectric structures 120 and the vertical transfer gates 122 line the corresponding trenches 118 with the transfer gate dielectric structures 120 arranged between the pixel regions 108 and the vertical transfer gates 122.

Also shown by FIG. 10, the transistor gates 138 of other pixel transistors (other than the transfer transistors) and corresponding pixel gate dielectric structures 140 are formed over the collector regions 112. The other pixel transistor gates 138 are formed over the corresponding pixel gate dielectric structures 140, which provide electrical isolation between the other pixel transistor gates 138 and the pixel regions 108. The other pixel transistor gates 138 include a source follower transistor gate 138 and, in some embodiments, a row select transistor gate and a reset transistor gate.

In some embodiments, the gate dielectric structures 120, 140 and the gates 122, 138 are formed simultaneously by performing a second etch through select regions of the first dielectric layer 902 and the conductive layer 904. For example, a fifth mask layer 1002 is formed over the semiconductor substrate 104"". The fifth mask layer 1002 masks regions of the first dielectric layer 902 and the conductive layer 904 other than those regions corresponding to the gate dielectric structures 120, 140 and the gates 122, 138, while leaving regions of the first dielectric layer 902 and the conductive layer 904 corresponding to the gate dielectric structures 120, 140 and the gates 122, 138 exposed. The second etch is then performed into the exposed regions of the first dielectric layer 902 and the conductive layer 904 to form the gate dielectric structures 120, 140 and the gates 122, 138.

Figure 11:
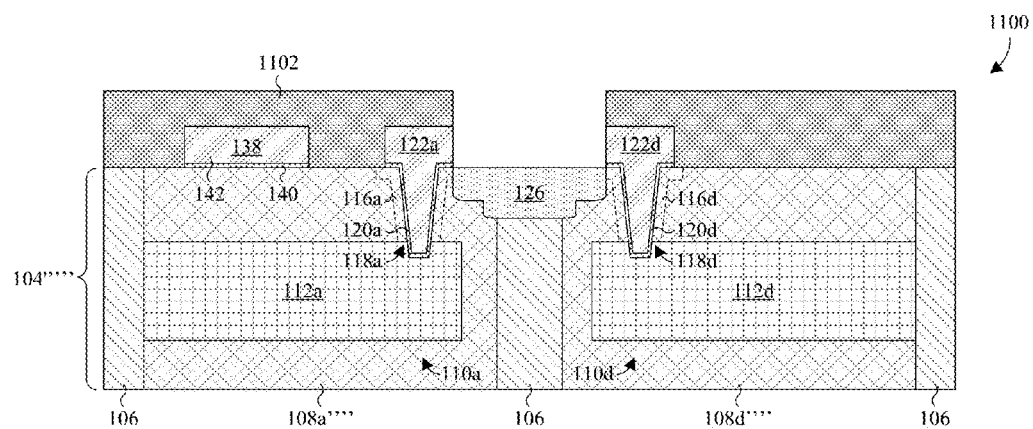

FIG. 11 illustrates a cross-sectional view 1100 of some embodiments corresponding to Action 408.

As shown by FIG. 11, a FDN 126 is formed over the peripheral isolation region 106' in electrical communication with channel regions 116a, 116d corresponding to the vertical transfer gates 122. Typically, there is a one-to-one correspondence between the channel regions 116 and the vertical transfer gates 122. When a vertical transfer gate 122 is activated (e.g., by applying a voltage to the vertical transfer gate 122), an inversion channel is formed in the corresponding channel region 116, thereby allowing accumulated charge in a corresponding photodetector 110 to flow from the collector region 112 to the FDN 126. The FDN 126 is, for example, a doped semiconductor region having an opposite type (i.e., p- or n-type) as the pixel regions 108, such as, for example, n-type. Typically, the FDN 126 and the collector regions 112 have the same type and double as source/drain regions for the transfer transistors 114.

In some embodiments, the FDN 126 is formed by performing a fourth ion implantation. For example, a sixth mask layer 1102 is formed over the semiconductor substrate 104''''. The sixth mask layer 1102 masks regions of the semiconductor substrate 104'''' other than those regions corresponding to the FDN 126, while leaving regions of the semiconductor substrate 104'''' corresponding to the FDN 126 exposed. The fourth ion implantation is then performed into the exposed regions of the semiconductor substrate 104'''' to form the FDN 126.

Figure 12:
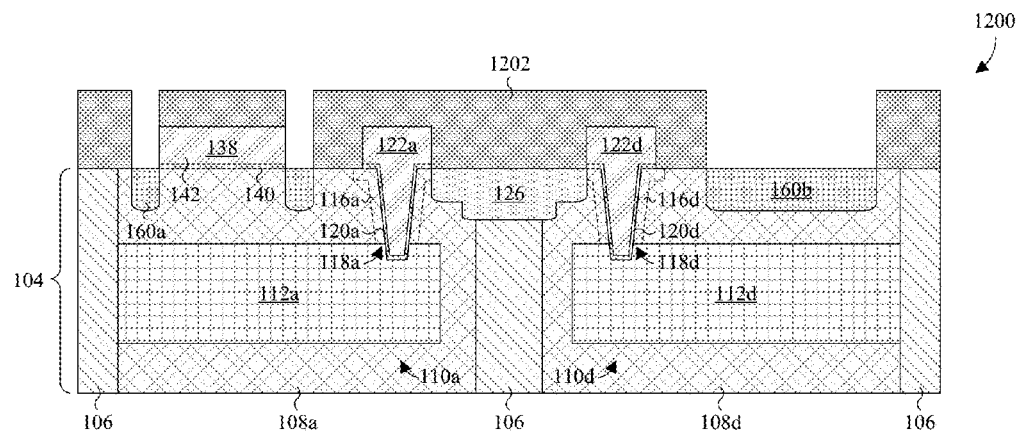

FIG. 12 illustrates a cross-sectional view 1200 of some embodiments corresponding to Action 410.

As shown by FIG. 12, implant isolation regions 160a, 160b are formed within the peripheral isolation and/or pixel regions 106, 108 around one or more of the pixel transistor gates 122, 138 for electrical isolation. The implant isolation regions 160 are, for example, highly doped semiconductor regions (relative to the pixel regions 108) of the same type as the pixel regions 108, so as to prevent leakage current.

In some embodiments, the implant isolation regions 160 are formed by performing a fifth ion implantation. For example, a seventh mask layer 1202 is formed over the semiconductor substrate 104'''''. The seventh mask layer 1202 masks regions of the semiconductor substrate 104'''' other than those regions corresponding to the implant isolation regions 160, while leaving regions of the semiconductor substrate 104'''' corresponding to the implant isolation regions 160 exposed. The fifth ion implantation is then performed into the exposed regions of the semiconductor substrate 104'''' to form the implant isolation regions 160.

Figure 13:
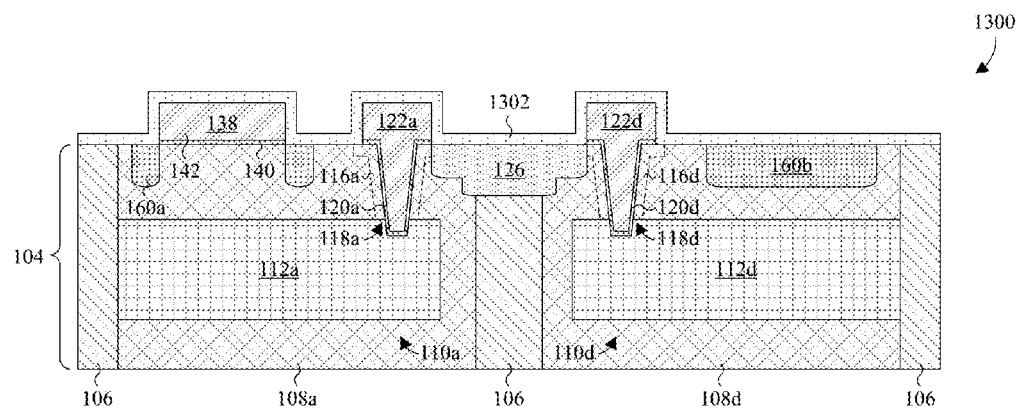
Figure 14:
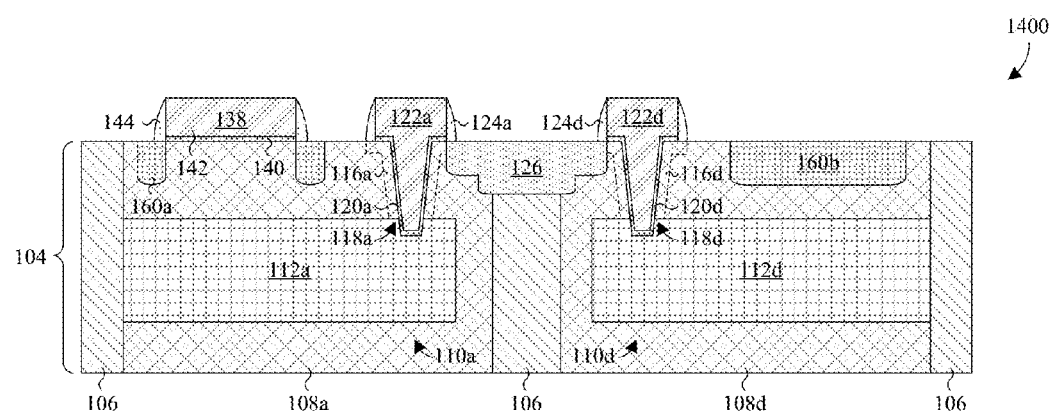

FIGS. 13 and 14 illustrate cross-sectional views 1300, 1400 of some embodiments corresponding to action performed subsequent to forming the implant isolation regions 160.

As shown by FIG. 13, a second dielectric layer 1302 is conformally formed over the semiconductor substrate 104 and the gates 122, 138. The second dielectric layer 1302 is, for example, silicon dioxide, silicon nitride, or silicon oxynitride.

As shown by FIG. 14, gate sidewall structures 124a, 124d, 144 lining sidewalls of the gates 122, 138 are formed. The gate sidewall structures 124, 144 are, for example, a dielectric, such as, for example, silicon dioxide or silicon nitride.

In some embodiments, the gate sidewall structures 124, 144 are formed simultaneously by performing a third etch through select regions of the second dielectric layer 1302 to remove horizontal stretches of the second dielectric layer 1302 while leaving vertical stretches of the second dielectric layer 1302 lining sidewalls. For example, an etchant is applied to the second dielectric layer 1302 for the approximate time needed to etch through the thickness of the second dielectric layer 1302.

Thus, as can be appreciated from above, the present disclosure provides an APS. A semiconductor substrate has a photodetector buried therein. A vertical transfer gate extends into the semiconductor substrate with a channel region in electrical communication with the photodetector. A pixel transistor is arranged over the photodetector and configured to facilitate readout of charge stored at the FDN. An implant isolation region is arranged in the semiconductor substrate and surrounds and electrically isolates the pixel transistor.

In other embodiments, the present disclosure provides a method for manufacturing an APS. A semiconductor substrate having a photodetector buried therein is provided. A vertical transfer gate extending into the semiconductor substrate is formed with a channel region in electrical communication with the photodetector. A pixel transistor is formed over the photodetector to facilitate pixel operation. An implant isolation region is formed in the semiconductor substrate surrounding and electrically isolating the pixel transistor.

In yet other embodiments, the present disclosure provides an APS. A semiconductor substrate has first and second pixel regions electrical isolated from each other by a peripheral isolation region. The first and second pixel regions have corresponding photodetectors buried therein. First and second vertical transfer gates correspond to the pixel regions. The first and second vertical transfer gates extend into the semiconductor substrate with corresponding channel regions in electrical communication with the photodetectors of the corresponding pixel regions. A pixel transistor is arranged over the photodetectors and configured to facilitate pixel operation. An implant isolation region is arranged in the semiconductor substrate and surrounds and electrically isolates the pixel transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An active pixel sensor (APS), comprising:
a semiconductor substrate comprising a pixel region and a collector region, wherein the pixel region extends continuously from a top surface of the semiconductor substrate to a top boundary of the collector region that is spaced below the top surface of the semiconductor substrate, and wherein the pixel region contacts the collector region at the top boundary to define a PN junction;
a photodetector buried in the semiconductor substrate, wherein the photodetector comprises the collector region;
a vertical transfer gate extending into the semiconductor substrate with a channel region in electrical communication with the photodetector;
a pixel transistor arranged directly over the photodetector, wherein the pixel transistor is configured to facilitate pixel operation and is independent of the vertical transfer gate, and wherein the pixel transistor is arranged laterally between and spaced from a sidewall boundary of the collector region and the vertical transfer gate; and an implant isolation region arranged in the semiconductor substrate, directly over the photodetector, and surrounding and electrically isolating the pixel transistor, wherein the implant isolation region comprises an inner vertical boundary and an outer vertical boundary laterally enclosing the inner vertical boundary, wherein the implant isolation region is a doped semiconductor region with an opposite doping type as the collector region of the photodetector, and wherein the collector region and the pixel region each have a single doping type.

2. The APS according to claim 1, further including:
a floating diffusion node (FDN) arranged in the semiconductor substrate and in electrical communication with the channel region.

3. The APS according to claim 1, wherein the pixel transistor is one of a source follower transistor, a reset transistor, and a row select transistor.

4. The APS according to claim 1, wherein the implant isolation region has a same doping type as the pixel region, and wherein the implant isolation region is more highly doped than the pixel region.

5. An active pixel sensor (APS), comprising:
a semiconductor substrate having first and second pixel regions electrically isolated from each other, wherein the first and second pixel regions extend into the semiconductor substrate from a top surface of the semiconductor substrate;
first and second photodetectors respectively buried in the first and second pixel regions;
a peripheral isolation region arranged between the first and second pixel regions to electrically isolate the first and second pixel regions, wherein the peripheral isolation region is a doped semiconductor region with the same doping type, and a higher doping concentration, as the first and second pixel regions;
first and second vertical transfer gates corresponding to the first and second pixel regions, the first and second vertical transfer gates extending into the semiconductor substrate with corresponding channel regions in electrical communication with the first and second photodetectors of the corresponding pixel regions;
a floating diffusion node (FDN) extending into the semiconductor substrate from the top surface of the semiconductor substrate and terminating at a bottom boundary that contacts an upper boundary of the peripheral isolation region, wherein the FDN is in electrical communication with the channel regions and is a semiconductor region with an opposite doping type as the peripheral isolation region;
a pixel transistor arranged over and partially covering each of the first and second photodetectors, wherein the pixel transistor is configured to facilitate pixel operation and is independent of the first and second vertical transfer gates; and
an implant isolation region arranged in the semiconductor substrate and surrounding and electrically isolating the pixel transistor.

6. The APS according to claim 5, wherein the pixel transistor and the implant isolation region are arranged directly over one of the first and second photodetectors, wherein an inner boundary of the implant isolation region is arranged along a periphery of the pixel transistor, and wherein an outer boundary of the implant isolation region is laterally spaced from the inner boundary in a direction away from the pixel transistor.

7. The APS according to claim 5, wherein the first and second pixel regions comprise respective collector regions of the first and second photodetectors that are buried in the semiconductor substrate, and wherein the first and second vertical transfer gates extend from over the semiconductor substrate to locations within the collector regions.

8. An active pixel sensor (APS), comprising:
a semiconductor substrate comprising a pixel region and a collector region with opposite doping types, wherein the collector region is buried in the pixel region and comprises a top boundary spaced below a top surface of the semiconductor substrate, wherein the top boundary contacts the pixel region to define a PN junction, and wherein the pixel region has a single doping type;
a photodetector buried in the pixel region of the semiconductor substrate and comprising the PN junction;
a transfer transistor comprising a vertical transfer gate that protrudes into the semiconductor substrate from over the semiconductor substrate, and further comprising a channel region in electrical communication with the photodetector;
a pixel transistor arranged directly over the photodetector, laterally spaced from the transfer transistor, and configured to facilitate pixel operation; and
a doped semiconductor region with the same doping type as the pixel region and a higher doping concentration than the pixel region, wherein the doped semiconductor region extends vertically into the pixel region, from the top surface of the semiconductor substrate, and terminates at a bottom boundary spaced over the PN junction, and wherein the doped semiconductor region comprises a pair of segments that are laterally spaced and respectively adjoin opposite sides of the pixel transistor.

9. The APS according to claim 8, wherein the doped semiconductor region is arranged directly over the photodetector and extends laterally to surround the pixel transistor, wherein an inner boundary of the doped semiconductor region is arranged along a periphery of the pixel transistor, and wherein an outer boundary of the doped semiconductor region is laterally spaced from the inner boundary in a direction away from the pixel transistor.

10. The APS according to claim 8, wherein the pixel transistor is one of a source follower transistor, a reset transistor, and a row select transistor.

11. The APS according to claim 1, wherein the vertical transfer gate is an electrode and is laterally spaced from the pixel transistor.

12. The APS according to claim 5, wherein the pixel transistor is laterally spaced from the first and second vertical transfer gates.

13. The APS according to claim 1, further comprising:
a peripheral isolation region extending into the semiconductor substrate, from the top surface of the semiconductor substrate, wherein a sidewall boundary of the peripheral isolation region contacts the sidewall boundary of the collector region and a sidewall boundary of the pixel region that is aligned with the sidewall boundary of the collector region.

14. The APS according to claim 1, wherein the implant isolation region is arranged laterally between and spaced from the sidewall of the collector region and the vertical transfer gate, and wherein the implant isolation region extends into the semiconductor substrate, from the top surface of the semiconductor substrate, and terminates at a bottom boundary spaced over the top boundary of the collector region.

15. The APS according to claim 5, wherein the semiconductor substrate further comprises first and second collector regions respectively buried in the first and second pixel regions, wherein the first and second pixel regions extend continuously from the top surface of the semiconductor substrate respectively to top boundaries of the first and second collector regions that are spaced below the top surface of the semiconductor substrate, wherein the first and second pixel regions respectively contact the first and second collector regions at the top boundaries to define PN junctions, and wherein the peripheral isolation region is arranged between the first and second collector regions.

16. The APS according to claim 5, wherein the implant isolation region is a doped semiconductor region with the same doping type, and a higher doping concentration, as the first and second pixel regions, and wherein the implant isolation region is independent of the peripheral isolation region.

17. The APS according to claim 8, further comprising:
a second doped semiconductor region with the same doping type as the pixel region and a higher doping concentration than the pixel region, wherein the second doped semiconductor region extends vertically into the pixel region, from the top surface of the semiconductor substrate, and terminates at a bottom boundary spaced below a bottom boundary of the collector region, and wherein the second doped semiconductor region comprises a pair of segments that are laterally spaced and respectively arranged on opposite sides of the collector region.

18. The APS according to claim 17, wherein the pair of segments comprises a first segment with a sidewall boundary contacting a first sidewall boundary of the collector region, and further comprises a second segment with a second sidewall boundary spaced from a second sidewall boundary of the collector region that is opposite the first sidewall boundary of the collector region.

19. The APS according to claim 1, wherein the semiconductor substrate further comprises a second pixel region electrically isolated from the pixel region, and wherein the APS further comprises:
a second photodetector buried in the second pixel region; and
a second vertical transfer gate extending into the second pixel region with a second channel region in electrical communication with the second photodetector, wherein the pixel transistor partially covers the photodetector and the second photodetector, and wherein the pixel transistor is independent of the vertical transfer gate and the second vertical transfer gate.

20. The APS according to claim 8, wherein the doped semiconductor region, the collector region, and the pixel region are each continuous with a single doping type.

* * * * *